United States Patent [19]

Ise et al.

[11] Patent Number: 4,622,478

[45] Date of Patent: Nov. 11, 1986

[54] POWER FREQUENCY DETECTION SYSTEM

[75] Inventors: Masahiro Ise, Kashihara; Hidehiko Tanaka, Tenri; Katsuyuki Machino, Nara; Toshiyuki Matsubara; Teiji Terasaka, both of Tenri, all of Japan

[73] Assignee: Sharp Kabushiki Kaisha, Osaka, Japan

[21] Appl. No.: 815,312

[22] Filed: Jan. 2, 1986

Related U.S. Application Data

[63] Continuation of Ser. No. 454,622, Dec. 30, 1982.

[51] Int. Cl.[4] .................. H03K 5/153; H03K 5/00
[52] U.S. Cl. .................. 307/354; 328/136; 328/140; 328/150
[58] Field of Search ............. 307/354; 328/150, 140, 328/136, 147, 149, 146; 340/310 A, 310 LP, 825.5

[56] References Cited

U.S. PATENT DOCUMENTS

| | | | |
|---|---|---|---|
| 3,491,305 | 1/1970 | Stone | 329/126 |
| 3,493,877 | 2/1970 | Jacobson | 329/103 |
| 3,559,080 | 1/1971 | Kobori et al. | 328/136 |
| 3,727,079 | 4/1973 | Garrett | 307/354 |
| 3,767,938 | 10/1973 | Kueper | 307/354 |
| 3,916,328 | 10/1975 | Wilson | 328/150 |
| 3,944,936 | 3/1976 | Pryor | 328/150 |
| 4,090,144 | 5/1978 | Jenik et al. | 328/150 |
| 4,377,804 | 3/1983 | Suzuki | 340/310 A |
| 4,418,333 | 11/1983 | Schwarzbach et al. | 340/310 A |

OTHER PUBLICATIONS

"Home Computor Control", by Steven E. Sarns, Radio Electronics, Apr. and May 1984.

Primary Examiner—Stanley D. Miller
Assistant Examiner—Richard Roseen
Attorney, Agent, or Firm—Birch, Stewart, Kolasch & Birch

[57] ABSTRACT

A signal transmission system utilizes the building or house wiring as the data transmission line. A frequency detection system is required to detect a frequency of the power voltage. The frequency detection system includes a zero-crossing detection circuit for developing a detection output when the zero-crossing is detected. A timer element is provided in the frequency detection system, which functions to neglect an output signal from the zero-crossing detection circuit for a preselected period of time after the last detection output has been developed from the zero-crossing detection circuit.

4 Claims, 9 Drawing Figures

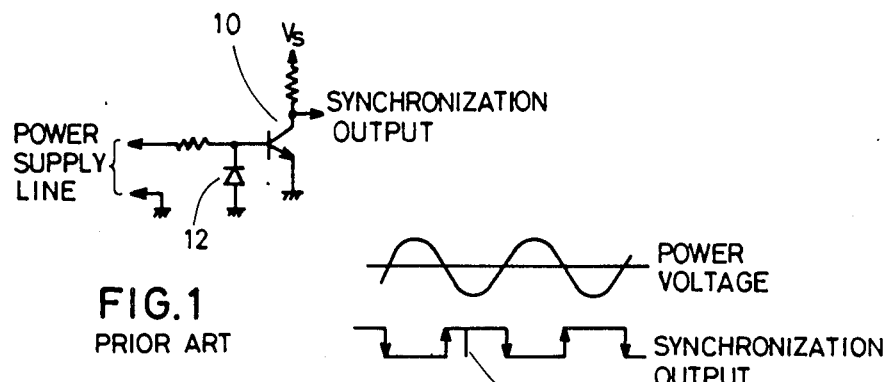
FIG.1 PRIOR ART
FIG.2 PRIOR ART
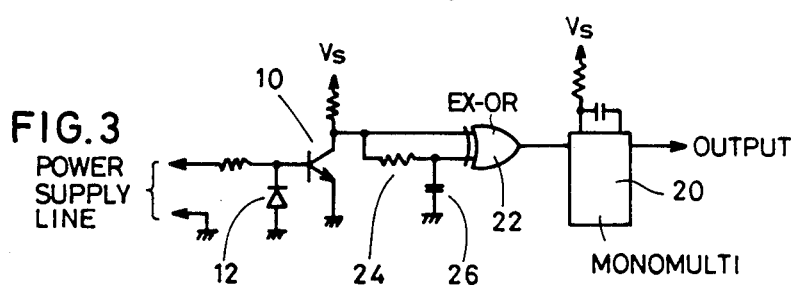
FIG.3
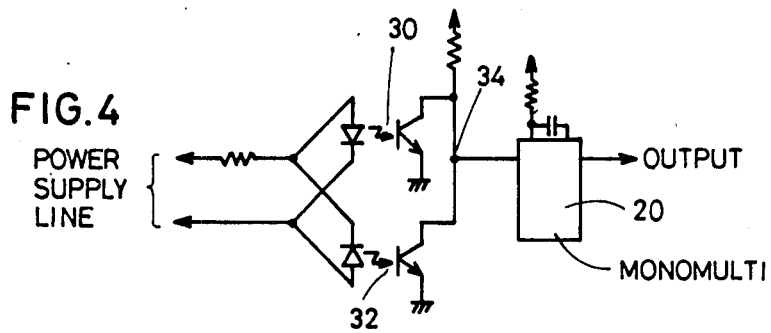
FIG.4
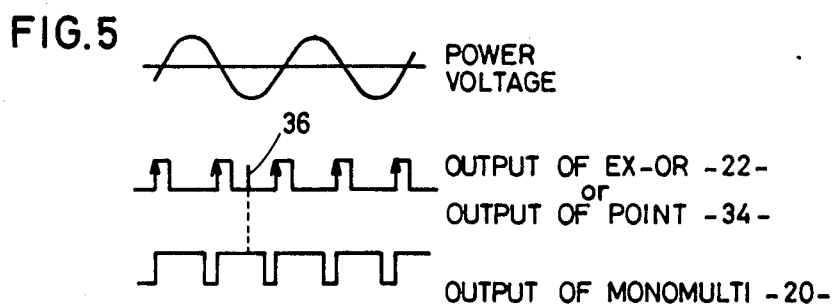
FIG.5

POWER FREQUENCY DETECTION SYSTEM

This application is a continuation of application Ser. No. 454,662, filed on Dec. 30, 1982.

BACKGROUND AND SUMMARY OF THE INVENTION

The present invention relates to a detection system for detecting a frequency of a power supply voltage and, more particularly, to a power frequency detection circuit in a signal transmission system which utilizes the building or house wiring.

A signal transmission system has been developed, which utilizes the building or house wiring as a data transmission line. In such a signal transmission system, the power frequency is often used as a reference clock. To achieve an accurate operation, the power frequency component must be correctly detected without regard to the noises.

Accordingly, an object of the present invention is to provide a detection system for detecting a frequency component of a power voltage.

Another object of the present invention is to provide a power frequency detection system for use in a signal transmission system which utilizes the building or house wiring as a data transmission line.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a zero-crossing detection circuit is provided for detecting the frequency component of the power voltage applied thereto. An inhibition system is provided for precluding the generation of an output from the zero-crossing detection circuit for a preselected period of time after the zero-crossing detection circuit has developed the previous detection output. The inhibition system minimizes an erroneous operation of the zero-crossing detection circuit as the zero-crossing detection circuit will not recognize any noise as the power frequency component as long as any noise occurs within the system while the zero-crossing detection circuit is placed in an inoperative condition by the inhibition system.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 1 is a schematic circuit diagram of a power frequency detection circuit of prior art;

FIG. 2 is a waveform chart for explaining an operational mode of the power frequency detection circuit of FIG. 1;

FIG. 3 is a circuit diagram of an embodiment of a power frequency detection system of the present invention;

FIG. 4 is a circuit diagram of another embodiment of a power frequency detection system of the present invention;

FIG. 5 is a waveform chart for explaining operational modes of the power frequency detection systems of FIGS. 3 and 4;

DESCRIPTION OF THE PREFERRED EMBODIMENTS

Figure 6:
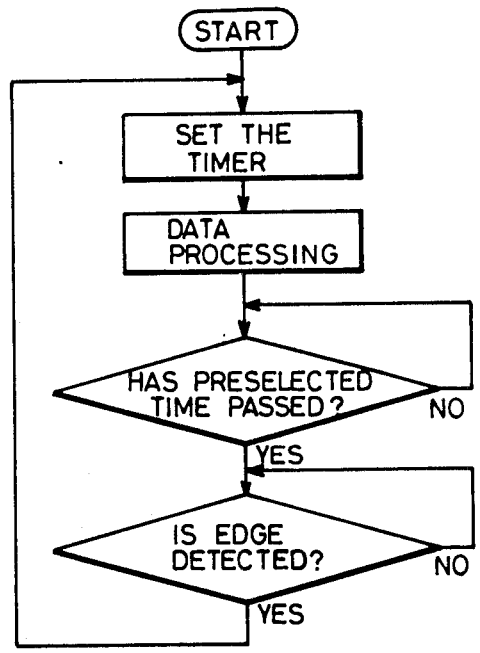
FIG. 6 is a flow chart for explaining an operational mode of still another embodiment of a power frequency detection system of the present invention.

A signal transmission system has been developed which utilizes the building or house wiring as a data transmission line. In such a system, the power frequency is used as a base clock. To detect the power frequency component, a zero-crossing detection circuit is generally employed. FIG. 1 shows a typical construction of the zero-crossing detection circuit which includes a transistor 10 and a diode 12. A system timing signal is obtained through the use of the leading edge or the trailing edge of a synchronization output derived from the zero-cross level detection circuit (see FIG. 2).

In such a detection system, when noises are superimposed on the power supply voltage, there is a possibility that an erroneous detection output 14 appears in the synchronization output. Appearance of the erroneous detection output 14 depends on the noise level and the timing of the noises. The erroneous detection output 14 may provide an incorrect operation of the signal transmission system.

The frequency of the occurrence of the erroneous detection output 14 is considerably lower than the power frequency. Furthermore, the power frequency is normally known. Therefore, if a system is constructed to neglect the power voltage variation for a preselected period of time after the last edge has been detected, the erroneous detection output 14 will be removed.

FIG. 3 shows an embodiment of a power frequency detection system of the present invention. FIG. 4 shows another embodiment of the power frequency detection system of the present invention. Two embodiments differ from each other at an edge detection section for detecting the zero-cross timing of the power supply voltage. Both embodiments include a monostable multivibrator 20 (not retriggerable).

The monostable multivibrator 20 must be triggered by either a leading or trailing edge of a same polarity every half cycle of the power supply voltage. In the embodiment of FIG. 3, a detection output of a zero-crossing detection circuit, which includes the transistor 10 and the diode 12, is directly applied to one input terminal of an exclusive OR gate 22. The other input terminal of the exclusive OR gate 22 receives a delayed detection output of the zero-cross detection circuit via an integration circuit including a resistor 24 and a capacitor 26. An output signal of the exclusive OR gate 22 is applied to the monostable multivibrator 20.

In the embodiment of FIG. 4, a zero-crossing detection circuit includes photo-couplers 30 and 32 which function, in combination, as a wired OR gate.

A point 34 provides a detection output signal as shown in FIG. 5. The thus obtained detection output signal is applied to the monostable multivibrator 20.

It will be clear from FIG. 5 that the output signal of the exclusive OR gate 22 in FIG. 3 or the output signal obtained at the point 34 in FIG. 4 bears a high level when the power voltage polarity changes. That is, the output signals of the exclusive OR gate 22 and the photo-couplers 30 and 32 are the zero-cross detection signal. Once the monostable multivibrator 20 is set, noises such as an erroneous detection signal 36 are neglected as long as the monostable multivibrator 20 is in the set state. That is, an output signal of the monostable multivibrator 20 is not influenced by the erroneous detection signal 36. To ensure an accurate operation of the power frequency detection systems of FIGS. 3 and 4, the pulse width of the monostable multivibrator 20 is selected slightly shorter than one half of the period of the power supply voltage. In a preferred form, the pulse width of the monostable multivibrator 20 is selected at 7.5 milliseconds when the power supply voltage has a frequency of 60 Hz.

A microcomputer is widely used in a control system of the power line signal transmission system. Generally, the microcomputer includes a programmable timer. By utilizing the programmable timer, a desired operation can be conducted as the circuits shown in FIGS. 3 and 4.

FIG. 6 shows an operational flow when the above-mentioned programmable timer is used to control the power frequency detection. First, the programmable timer is set to a desired value. Then, the data processing is conducted. After the preselected period of time has passed, the above-mentioned edge detection is carried out. When the edge is detected, the programmable timer is again set to perform the next edge detection.

Figure 7:
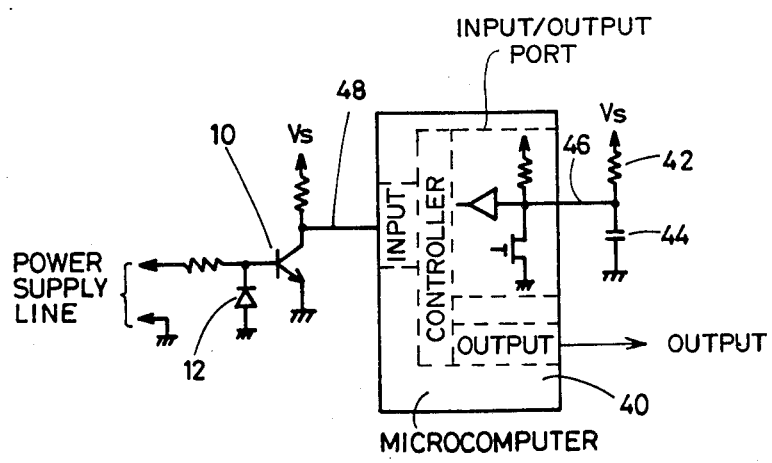
FIG. 7 is a circuit diagram of yet another embodiment of a power frequency detection system of the present invention.

Even when the programmable timer is not included in the microcomputer, similar control may be conducted. A one-chip microcomputer 40 generally includes an input/output port of the bidirectional type. One of the bits can be used to form an analog integration timer as shown in FIG. 7. More specifically, a resistor 42 and a capacitor 44 are connected to a terminal 46 of the microcomputer 40. The zero-cross level detection circuit including the transistor 10 and the diode 12 is connected to a terminal 48 of the microcomputer 40.

Figure 8:
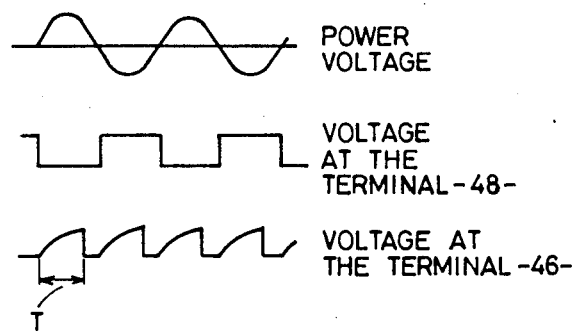
FIG. 8 is a waveform chart for explaining an operational mode of the power frequency detection system of FIG. 7.
Figure 9:
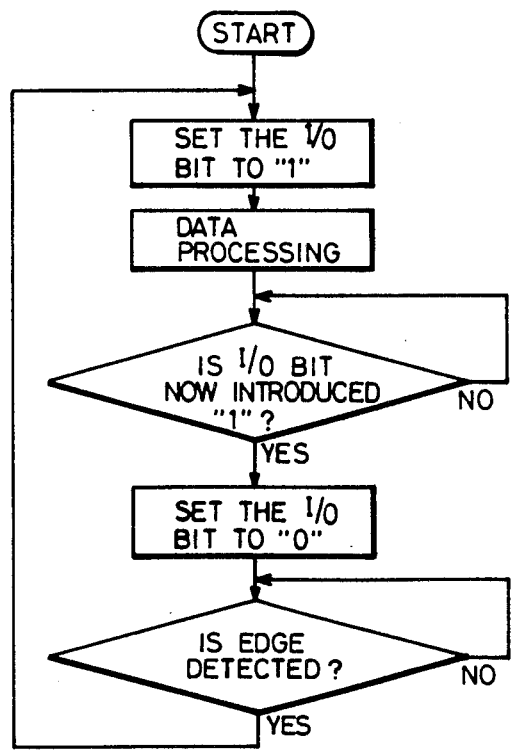
FIG. 9 is a flow chart for explaining an operational mode of the power frequency detection system of FIG. 7.

FIG. 8 shows signals occurring within the circuit of FIG. 7. FIG. 9 shows an operational flow of the circuit of FIG. 7.

First, the input/output bit is set to "1". Then, the data processing operation is conducted. Thereafter, a determination is conducted as to whether the introduced input/output bit (signal at the terminal 46) is "1". If an affirmative answer is obtained, the input/output bit is set to "0", and the edge detection operation is carried out.

In this embodiment, the timer set period T is represented as follows.

$$T = kCR$$

where:

$$k = -\ln\left(1 - \frac{V_{th}}{V_s}\right)$$

C is the capacitance value of the capacitor 44, and

R is the resistance value of the resistor 42.

In the TTL type construction, $V_{th}$ is about 1.4 volts, and $V_s$ is 5 volts. Thus, k is 0.33. If the power supply voltage has the frequency of 60 Hz, the one half period is 8.3 milliseconds. Accordingly, if the timer set period T is desired to be set at a value slightly shorter than the one half period (8.5 milliseconds), for example, 7.5 milliseconds, the capacitance value C of the capacitor 44 should be selected between 6.9 microfarads and 6.8 microfarads because the resistor 42 is generally selected at 3.3 kilohms due to the sink current in the input/output port (generally, 1.6 milliamperes).

The invention being thus described, it will be obvious that the same may be varied in many ways. Such variations are not to be regarded as a departure from the spirit and scope of the invention, and all such modifications are intended to be included within the scope of the following claims.

What is claimed is:

1. A detection system for detecting a frequency of a power voltage applied thereto comprising:
    zero-crossing detection means for detecting a zero-crossing of the power voltage and developing a detection signal when each zero-crossing is detected to form a detection signal train; and
    inhibition means responsive to said detection signal train for inhibiting the output of said detection signal for a preselected period of time after an immediately preceding said detection signal has been developed to thereby prevent a detecting of a false zero-crossing resultant from noise, said inhibition means comprising,
    means, responsive to said detection signal train, for delaying said detection signal train to form a delayed signal train,
    an exclusive OR gate receiving said detection signal train at a first input thereof and receiving said delayed signal train at a second input thereof to produce a detected zero-crossing pulse train, and
    a monostable multivibrator receiving said detected zero-crossing pulse train at its input and developing a true zero crossing output as an output of said inhibition means, said multivibrator having a pulse generating period slightly less than an expected period between adjacent zero-crossings of said power voltage.

2. A detection system for detecting a frequency of a power voltage applied thereto comprising:
    zero-crossing detection means for detecting a zero-crossing of the power voltage and developing a detection signal when each zero-crossing is detected to form a detection signal train, said zero-crossing detection means including,
    first and second cross-coupled photo-couplers having their inputs arranged in parallel across said power voltage, said photo-couplers having commonly connected outputs developing said detection signal train; and
    inhibition means responsive to said detection signal train for inhibiting the output of said detection signal for a preselected period of time after an immediately preceding said detection signal has been developed to thereby prevent a detecting of a false zero-crossing resultant from noise, said inhibition means including, a monostable multivibrator receiving said detection signal train at its input and developing a true zero-crossing output, said multivibrator having a pulse generating period slightly less than the expected period between adjacent zero-crossings of said power voltage.

3. A detection system for detecting a frequency of a power voltage applied thereto comprising:

a zero-crossing pulse detection means for detecting zero-crossing of the power voltage and developing a first detection signal train including a zero-crossing detection signal developed each time the zero-crossing is detected;

timer means for counting a preselected period of time after a most recent said zero-crossing detection signal has been developed, and developing a control signal when said preselected period of time has passed; and control means for developing a second detection signal as a function of said first detection signal when said control signal is developed from said timer means, said second detection signal being used as an output signal of the detection system and representing only true zero-crossings of said power voltage.

4. The detection system of claim 3 wherein said control means comprises a microcomputer; said timer means including, a bidirectional input/output port of said microcomputer; and an analog integration timer connected to said input/output port;

said microcomputer developing a logical high output to said input/output port upon receipt of a said zero-crossing detection pulse;

said analog integration timer developing a logical low output at said input/output port a predetermined time after said logical high output has developed on said input/output port of said microcomputer to form said control signal.

* * * * *